United States Patent
Herr et al.

(10) Patent No.: US 10,587,245 B1
(45) Date of Patent: Mar. 10, 2020

(54) SUPERCONDUCTING TRANSMISSION LINE DRIVER SYSTEM

(71) Applicants: Anna Y. Herr, Ellicott City, MD (US); Randall M. Burnett, Catonsville, MD (US); Jonathan D. Egan, Hanover, MD (US)

(72) Inventors: Anna Y. Herr, Ellicott City, MD (US); Randall M. Burnett, Catonsville, MD (US); Jonathan D. Egan, Hanover, MD (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 0 days.

(21) Appl. No.: 16/188,730

(22) Filed: Nov. 13, 2018

(51) Int. Cl.
| | | |
|---|---|---|
| *H01L 39/02* | (2006.01) | |
| *H03K 3/012* | (2006.01) | |
| *H03H 7/01* | (2006.01) | |
| *H03K 17/92* | (2006.01) | |
| *H03K 19/195* | (2006.01) | |

(52) U.S. Cl.
CPC .......... *H03K 3/012* (2013.01); *H03H 7/0115* (2013.01); *H03K 17/92* (2013.01); *H03K 19/195* (2013.01)

(58) Field of Classification Search
USPC .................................................. 327/108–112
See application file for complete search history.

(56) References Cited

U.S. PATENT DOCUMENTS

| | | | | |
|---|---|---|---|---|
| 4,623,804 | A | | 11/1986 | Goto |
| 5,436,451 | A | * | 7/1995 | Silver ........................ G01J 5/30 |
| | | | | 250/336.1 |
| 5,936,458 | A | * | 8/1999 | Rylov ....................... H03K 3/38 |
| | | | | 327/528 |
| 6,157,329 | A | | 12/2000 | Lee et al. |
| 6,242,939 | B1 | * | 6/2001 | Nagasawa ............... G11C 11/44 |
| | | | | 326/3 |
| 6,331,805 | B1 | | 12/2001 | Gupta et al. |
| 6,653,962 | B2 | | 11/2003 | Gupta et al. |

(Continued)

FOREIGN PATENT DOCUMENTS

| | | |
|---|---|---|
| JP | 2013058998 A | 3/2013 |
| WO | 98/08307 A1 | 2/1998 |

(Continued)

OTHER PUBLICATIONS

International Search Report and Written Opinion for PCT/US2019/019182 dated Jul. 19, 2019.

(Continued)

*Primary Examiner* — Adam D Houston
(74) *Attorney, Agent, or Firm* — Tarolli, Sundheim, Covell & Tummino LLP

(57) ABSTRACT

One example includes a superconducting transmission line driver system. The system includes an input stage configured to receive an input pulse and an AC bias current source configured to provide an AC bias current. The system also includes an amplifier coupled to the input stage and configured to generate a plurality of sequential SFQ pulses based on the input pulse in response to the AC bias current. The system further includes a low-pass filter configured to filter the plurality of sequential SFQ pulses to generate an amplified output pulse that is output to a transmission line.

20 Claims, 3 Drawing Sheets

(56) References Cited

U.S. PATENT DOCUMENTS

| | | | |
|---|---|---|---|
| 7,095,227 B2 | 8/2006 | Tarutani et al. | |
| 7,227,480 B2 | 6/2007 | Furuta et al. | |
| 7,598,897 B2 | 10/2009 | Kirichenko | |
| 7,724,020 B2 | 5/2010 | Herr | |
| 7,724,083 B2 | 5/2010 | Herr et al. | |
| 7,786,748 B1 | 8/2010 | Herr | |
| 8,188,901 B1* | 5/2012 | Inamdar | H03M 3/02 341/156 |
| 8,952,671 B2* | 2/2015 | Shimizu | G05F 1/575 323/283 |
| 9,097,751 B1 | 8/2015 | Longhini et al. | |
| 9,174,840 B2 | 11/2015 | Herr et al. | |
| 9,312,878 B1 | 4/2016 | Inamdar et al. | |
| 9,443,576 B1* | 9/2016 | Miller | G11C 11/44 |
| 9,455,707 B2 | 9/2016 | Herr et al. | |
| 9,467,126 B1* | 10/2016 | Naaman | H03K 3/38 |
| 9,497,126 B2 | 11/2016 | Matsuhira | |
| 9,595,970 B1* | 3/2017 | Reohr | H03K 19/195 |
| 9,613,699 B1* | 4/2017 | Reohr | G11C 11/44 |
| 9,646,682 B1* | 5/2017 | Miller | G11C 7/06 |
| 9,853,645 B1 | 12/2017 | Mukhanov et al. | |
| 9,887,700 B2 | 2/2018 | Carmean et al. | |
| 2001/0025012 A1* | 9/2001 | Tarutani | H01L 27/18 505/100 |
| 2004/0201099 A1* | 10/2004 | Herr | H03F 19/00 257/758 |
| 2004/0201400 A1* | 10/2004 | Herr | G11C 11/44 326/3 |
| 2005/0047245 A1* | 3/2005 | Furuta | G11C 7/06 365/222 |
| 2005/0078022 A1 | 4/2005 | Hirano et al. | |
| 2005/0231196 A1* | 10/2005 | Tarutani | H03K 19/1954 324/248 |
| 2006/0049891 A1 | 3/2006 | Crete | |
| 2006/0255987 A1* | 11/2006 | Nagasawa | G11C 11/44 341/87 |
| 2008/0049885 A1* | 2/2008 | Inamdar | H03K 5/13 375/376 |
| 2009/0002014 A1* | 1/2009 | Gupta | H03F 19/00 326/3 |
| 2010/0026537 A1 | 2/2010 | Kirichenko | |
| 2010/0033252 A1* | 2/2010 | Herr | H03F 3/605 330/286 |
| 2012/0274494 A1* | 11/2012 | Kirichenko | H03M 3/454 341/133 |
| 2015/0092465 A1* | 4/2015 | Herr | B82Y 10/00 363/125 |
| 2015/0094207 A1* | 4/2015 | Herr | H01L 27/18 505/171 |
| 2015/0349780 A1* | 12/2015 | Naaman | H03K 19/1958 326/5 |
| 2016/0013791 A1* | 1/2016 | Herr | H03K 3/38 326/5 |
| 2016/0079968 A1* | 3/2016 | Strand | H01L 39/2493 327/528 |
| 2016/0164505 A1* | 6/2016 | Naaman | H03K 3/38 327/528 |

FOREIGN PATENT DOCUMENTS

| | | |
|---|---|---|
| WO | 2014/028302 A2 | 2/2014 |
| WO | 2017/204977 A1 | 11/2017 |
| WO | 2018/044563 A1 | 3/2018 |

OTHER PUBLICATIONS

Invitation to Pay Additional Fees for International Application No. PCT/US2019/054968 dated Jan. 3, 2020.

* cited by examiner

US 10,587,245 B1

SUPERCONDUCTING TRANSMISSION LINE DRIVER SYSTEM

GOVERNMENT INTEREST

The invention was made under Government Contract Number W911NF-14-C-0115. Therefore, the US Government has rights to the invention as specified in that contract.

TECHNICAL FIELD

This disclosure relates generally to classical and quantum computing systems, and more specifically to a superconducting transmission line driver system.

BACKGROUND

Superconducting digital technology has provided computing and/or communications resources that benefit from unprecedented high speed, low power dissipation, and low operating temperature. Quantum computer systems typically implement very low amplitude voltage pulses, such as single flux quantum (SFQ) pulses or reciprocal quantum logic (RQL) pulses to communicate data. Such very low amplitude voltage pulses are implemented for substantially all logic functions and/or communication of data between different logic gates and/or different portions of a given quantum computer system. As an example, a quantum computer system can include an interface that couples portions of the computer system between a cold-space (e.g., in which superconducting occurs) and a non-cold space where classical computing functions are performed. Additionally, interconnects can extend along long transmission lines, such that signal attenuation can be a concern for the very low amplitude voltage pulses.

SUMMARY

One example includes a superconducting transmission line driver system. The system includes an input stage configured to receive an input pulse and an AC bias current source configured to provide an AC bias current. The system also includes an amplifier coupled to the input stage and configured to generate a plurality of sequential single flux quantum (SFQ) pulses based on the input pulse in response to the AC bias current. The system further includes a low-pass filter configured to filter the plurality of sequential SFQ pulses to generate an amplified output pulse that is output to a transmission line.

Another example includes a method for providing an amplified output pulse to a transmission line. The method includes providing an AC current to a transformer to inductively provide an AC bias current. The method further includes providing an input pulse to an input stage to trigger at least one unshunted Josephson junction associated with a SQUID via the input pulse and the AC bias current. The at least one unshunted Josephson junction can be configured to generate a plurality of sequential SFQ pulses in response to being triggered. The plurality of sequential SFQ pulses can be filtered via a low-pass filter to generate the amplified output pulse that is provided on the transmission line via the low-pass filter.

Another example includes a superconducting transmission line driver system. The system includes an input stage configured to receive a reciprocal quantum logic (RQL) pulse and an AC bias current source configured to inductively provide an AC bias current based on an RQL clock signal. The system also includes a SQUID coupled to the input stage and configured to generate a plurality of sequential positive SFQ pulses in a positive portion of the AC bias current and in response to the input pulse, and to generate a plurality of negative flux quantum pulses in a negative portion of the AC bias current. The system further includes a low-pass filter configured to filter the plurality of sequential positive SFQ pulses to generate an amplified positive output pulse that is output to a transmission line, and to filter the plurality of sequential negative SFQ pulses to generate an amplified negative output pulse that is output to the transmission line.

DETAILED DESCRIPTION

This disclosure relates generally to classical and quantum computing systems, and more specifically to a superconducting transmission line driver system. The superconducting transmission line driver system can include an input stage that is configured to receive a trigger pulse, such as a single flux quantum (SFQ) pulse or a reciprocal quantum logic (RQL) pulse, to initiate activation of the superconducting transmission line driver system. As an example, the trigger pulse can correspond to a data pulse that is intended to be communicated across a transmission line (e.g., an approximately 25-ohm transmission line) that is configured to propagate the data pulse to mitigate signal attenuation with respect to a receiving device. The superconducting transmission line driver system can also include an AC bias current source configured to generate an AC bias current. As an example, the AC bias current source can be configured as a transformer configured to propagate an AC signal, such as an RQL clock signal, in a primary winding to inductively provide the AC bias current via a secondary winding.

The superconducting transmission line driver system also includes an amplifier that is coupled to the input stage and that is configured to generate a sequential plurality of flux pulses based on the trigger pulse. As an example, the amplifier can be configured as a superconducting quantum interference device (SQUID). The SQUID includes at least one Josephson junction that is configure to be activated in response to the AC bias current and the trigger pulse to generate the plurality of sequential SFQ pulses. For example, the Josephson junction(s) can be unshunted to provide substantially repeated triggering at a very high frequency (e.g., approximately 250 GHz). As an example, the input stage can include a resistor coupled to the amplifier (e.g., to each of a pair of the unshunted Josephson junctions of the SQUID) to provide for a common mode triggering of the Josephson junctions. The superconducting transmission line driver system can also include a low-pass filter that is coupled to the amplifier, such that the sequential SFQ pulses can be filtered to generate a single amplified output pulse that is provided on the transmission line. Because the superconducting transmission line driver system implements an AC bias current, the negative portion of the AC bias current can be implemented, for example, to reset the unshunted Josephson junction(s) of the SQUID, and can thus provide an amplified negative output pulse on the transmission line via the low-pass filter.

Figure 1:
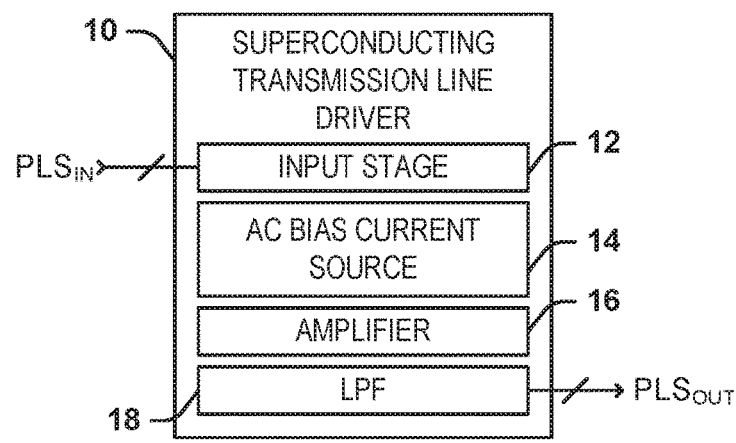
FIG. 1 illustrates an example of a superconducting transmission line driver system.

FIG. 1 illustrates an example of a superconducting transmission line driver system 10. The superconducting transmission line driver system 10 can be implemented in any of a variety of quantum computing applications to provide data across a transmission line. As a result, a quantum data pulse (e.g., an SFQ pulse or RQL pulse) can be provided across the long transmission line without attenuating to an unusable amplitude at the receiver device.

The superconducting transmission line driver system 10 includes an input stage 12 that is configured to receive a trigger pulse, demonstrated in the example of FIG. 1 as a signal $PLS_{IN}$. As an example, the trigger pulse $PLS_{IN}$ can be provided as a single flux quantum (SFQ) pulse or a reciprocal quantum logic (RQL) pulse that carries data in a quantum computing environment. As an example, the input stage 12 can include a Josephson transmission line (JTL) to propagate the trigger pulse $PLS_{IN}$, such as from a sequence of other JTLs. In addition, the input stage 12 can include a Josephson junction that is configured to trigger in response to the trigger pulse $PLS_{IN}$. The superconducting transmission line driver system 10 also includes an AC bias current source 14 that is configured to generate an AC bias current. As an example, the AC bias current source 14 can be configured as a transformer configured to propagate an AC signal, demonstrated in the example of FIG. 1 as a signal AC, in a primary winding to inductively provide the AC bias current via a secondary winding. For example, the signal AC can correspond to an RQL clock signal (e.g., the in-phase component, the quadrature-phase component, or a combination thereof).

The superconducting transmission line driver system 10 also includes an amplifier 16 that is coupled to the input stage 12 and is configured to amplify the trigger pulse $PLS_{IN}$, such as in a manner that provides for a sequential plurality of flux pulses. As an example, the amplifier 16 can be configured as a superconducting quantum interference device (SQUID) that includes at least one Josephson junction that is configure to be activated in response to the AC bias current and the trigger pulse $PLS_{IN}$ to generate the plurality of sequential SFQ pulses. For example, the Josephson junction(s) can be unshunted to provide substantially repeated triggering at a very high frequency (e.g., 60 GHz). As an example, the input stage 12 can include a resistor coupled to the amplifier 16, such as to each of a pair of the unshunted Josephson junctions of the SQUID to provide for a common mode triggering of the Josephson junctions.

The superconducting transmission line driver system 10 also includes a low-pass filter (LPF) 18 that is coupled to the amplifier 16. The LPF 18 can be arranged, for example, as an LC filter that interconnects the amplifier 16 and the transmission line. The LPF 18 is configured to filter the sequential SFQ pulses generated by the amplifier 16 to generate a single amplified output pulse, demonstrated in the example of FIG. 1 as $PLS_{OUT}$. For example, the LPF 18 is configured to aggregate the sequential flux pulses to generate the single amplified output pulse $PLS_{OUT}$. Therefore, the amplified output pulse can be provided on the transmission line at the output. For example, the transmission line can be a 25-ohm transmission line to propagate the amplified output pulse $PLS_{OUT}$ along a length to maintain sufficient signal amplitude. Therefore, the integrity of the amplified output pulse $PLS_{OUT}$ can be maintained across a significant length of the transmission line to be received at a receiver device.

As an example, the superconducting transmission line driver system 10 can be configured to operate in an RQL quantum computer system. For example, in response to the trigger pulse $PLS_{IN}$ being provided as an RQL pulse, the positive fluxon of the RQL trigger pulse $PLS_{IN}$ can activate the amplifier 16 along with the positive portion of the AC bias current. Therefore, during the positive portion of the AC bias current, the amplifier 16 can provide the sequential flux pulses as positive flux pulses that are filtered via the LPF 18 to provide a positive amplified output pulse. During the negative portion of the AC bias current, the amplifier 16 can generate a sequence of negative flux pulses, such as corresponding to reset of the unshunted Josephson junctions of the SQUID corresponding to the amplifier 16 (e.g., a return to the zero-energy state). The negative flux pulses can thus be filtered by the LPF 18 to generate an amplified negative output pulse. Accordingly, the superconducting transmission line driver system 10 can propagate an RQL pulse across the transmission line.

Figure 2:
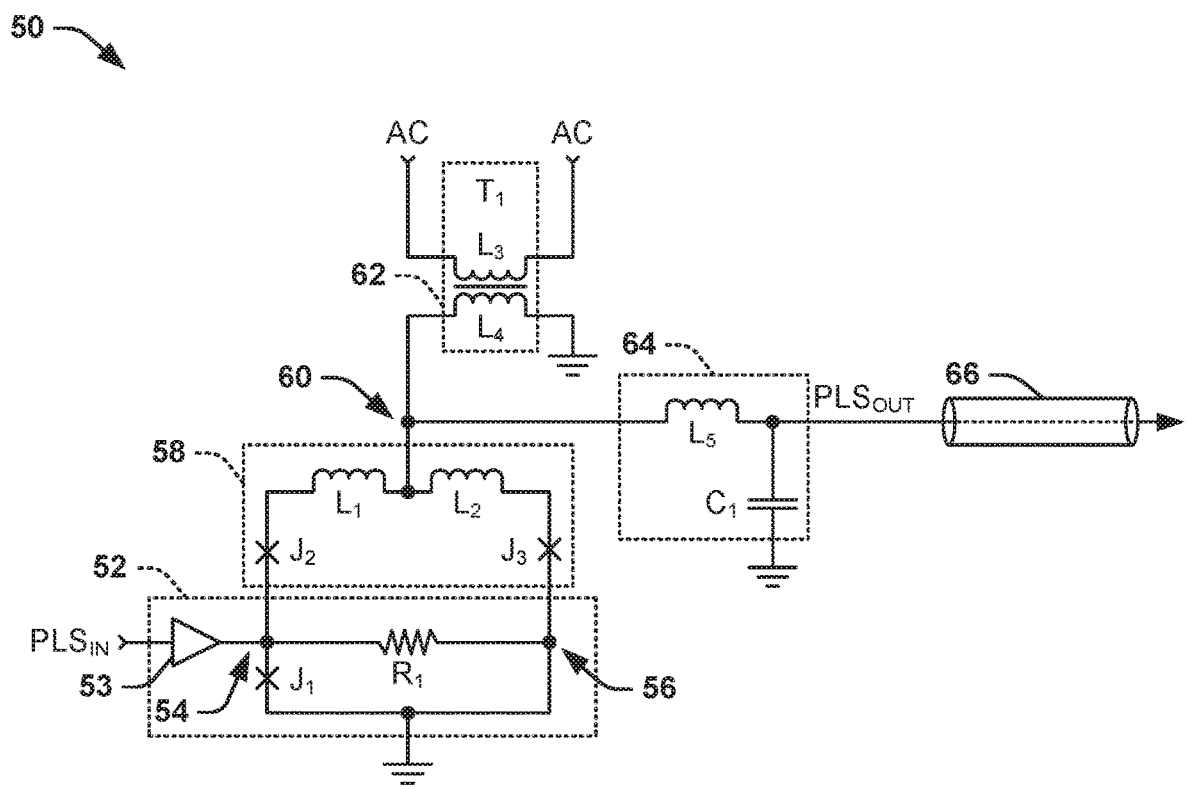
FIG. 2 illustrates an example of a superconducting transmission line driver circuit.

FIG. 2 illustrates an example of a superconducting transmission line driver circuit 50. The superconducting transmission line driver circuit 50 can correspond to the superconducting transmission line driver system 10 in the example of FIG. 1. Therefore, reference is to be made to the example of FIG. 1 in the following example of FIG. 2.

The superconducting transmission line driver circuit 50 includes an input stage 52 that is configured to receive a trigger pulse, demonstrated in the example of FIG. 2 as a signal $PLS_{IN}$. As an example, the trigger pulse $PLS_{IN}$ can be provided as an SFQ pulse or an RQL pulse that carries data in a quantum computing environment. In the example of FIG. 2, the input stage 52 includes a JTL 53 to propagate the trigger pulse $PLS_{IN}$, such as from a sequence of other JTLs. In addition, the input stage 52 includes a Josephson junction $J_1$ that is configured to trigger in response to the trigger pulse $PLS_{IN}$. As an example, the Josephson junction $J_1$ can be arranged as an unshunted Josephson junction. The input stage 52 further includes a resistor $R_1$ that is coupled to a node 54 and a node 56. For example, the resistor $R_1$ can be configured to provide shunting for the Josephson junction $J_1$.

The superconducting transmission line driver circuit 50 also includes a SQUID 58 that is coupled to the input stage 52. The SQUID 58 includes a first Josephson junction $J_2$ and a second Josephson junction $J_3$ that are coupled, respectively, to the nodes 54 and 56, such that the nodes 54 and 56 form a portion of the SQUID 58. In the example of FIG. 2, the Josephson junctions $J_2$ and $J_3$ can be configured as unshunted Josephson junctions. The SQUID 58 also includes a pair of inductors $L_1$ and $L_2$ that are coupled, respectively, to the Josephson junctions $J_2$ and $J_3$ and which are separated by a node 60. While the inductors $L_1$ and $L_2$ are demonstrated as a pair of inductors, it is to be understood that the inductors $L_1$ and $L_2$ can be arranged as a single inductor with a connection in an approximate center instead of the node 60, as described in greater detail herein.

The superconducting transmission line driver circuit 50 also includes an AC bias current source 62 that is demonstrated in the example of FIG. 2 as a transformer $T_1$. The transformer $T_1$ includes a primary winding $L_3$ through which an AC signal AC is provided, and includes a secondary winding $L_4$. As an example, the AC signal AC can be an in-phase component, a quadrature-phase component, or a combination thereof of an RQL clock signal. Therefore, the transformer $T_1$ can inductively provide an AC bias current $I_{BIAS}$ via the secondary winding $L_4$. The AC bias current $I_{BIAS}$ is provided to the node 60 to bias the Josephson junctions $J_2$ and $J_3$ of the SQUID 58. Therefore, in response to the trigger pulse $PLS_{IN}$, the Josephson junction $J_1$ can trigger, which can thus activate the Josephson junctions $J_2$ and $J_3$ to likewise trigger in response to a positive portion of the AC bias current $I_{BIAS}$ (e.g., during a positive portion of the AC bias current $I_{BIAS}$).

As an example, the triggering of the Josephson junctions $J_2$ and $J_3$ can result in the Josephson junctions $J_2$ and $J_3$ activating in a voltage state. As a result, the Josephson junctions $J_2$ and $J_3$ can sequentially and repeatedly trigger to increase in superconducting phase. Because the resistor $R_1$ is arranged as coupled to the Josephson junctions $J_2$ and $J_3$, the repeated triggering of the Josephson junctions $J_2$ and $J_3$ can be provided in a common mode manner, such that the Josephson junctions $J_2$ and $J_3$ repeatedly trigger substantially concurrently. The repeated triggering of the Josephson junctions $J_2$ and $J_3$ can be at a very high frequency (e.g., approximately 60 GHz), and can thus generate respective sequential flux pulses at the very high frequency. The sequential flux pulses are thus provided to the node 60.

The superconducting transmission line driver circuit 50 also includes an LPF 64 that is coupled to the SQUID 58 via the node 60. In the example of FIG. 2, the LPF 64 is demonstrated as an LC filter that includes an inductor $L_5$ that interconnects the node 60 and a transmission line 66 (e.g., an approximately 25-ohm transmission line), and also includes a capacitor $C_1$ interconnecting the inductor $L_5$ and a low-voltage rail (e.g., ground). The LPF 64 is configured to filter the sequential SFQ pulses generated by the SQUID 58 and provided on the node 60 to generate a single amplified output pulse, demonstrated in the example of FIG. 2 as $PLS_{OUT}$. For example, the LPF 64 is configured to aggregate the sequential flux pulses to generate the single amplified output pulse $PLS_{OUT}$. Therefore, the amplified output pulse can be provided on the transmission line 66 to propagate the amplified output pulse $PLS_{OUT}$ along a length to maintain sufficient signal amplitude. Therefore, the integrity of the amplified output pulse $PLS_{OUT}$ can be maintained across a significant length of the transmission line 66 to be received at a receiver device.

During a negative portion of the AC bias current $I_{BIAS}$, the Josephson junctions $J_2$ and J3 can be reset. For example, because the Josephson junctions $J_2$ and $J_3$ are unshunted, the Josephson junctions $J_2$ and $J_3$ do not reset themselves. Therefore, the negative amplitude of the AC bias current $I_{BIAS}$ can initiate an untriggering of the unshunted Josephson junctions $J_2$ and $J_3$, such that the Josephson junctions $J_2$ and $J_3$ return to a zero superconducting phase state. For each untriggering of the Josephson junctions $J_2$ and $J_3$, the Josephson junctions $J_2$ and $J_3$ generate a negative fluxon. Thus, during the negative portion of the AC bias current $I_{BIAS}$, the Josephson junctions $J_2$ and $J_3$ generate a sequential plurality of negative pulses that are provided to the node 60. As a result, similar to as described previously with respect to the positive portion of the AC bias current $I_{BIAS}$, the LPF 64 can filter the sequential negative flux pulses to generate the output pulse $PLS_{OUT}$ as a single negative amplified output pulse. The negative amplified output pulse $PLS_{OUT}$ is thus likewise provided on the transmission line 66. The reset Josephson junctions $J_2$ and $J_3$ are thus initialized to be able to activate on a next cycle (e.g., the next positive portion of the AC bias current $I_{BIAS}$). Accordingly, in addition to resetting the Josephson junctions $J_2$ and $J_3$, the negative portion of the AC bias current $I_{BIAS}$ can provide a negative amplified output pulse $PLS_{OUT}$, such as in an RQL computing environment.

Figure 3:
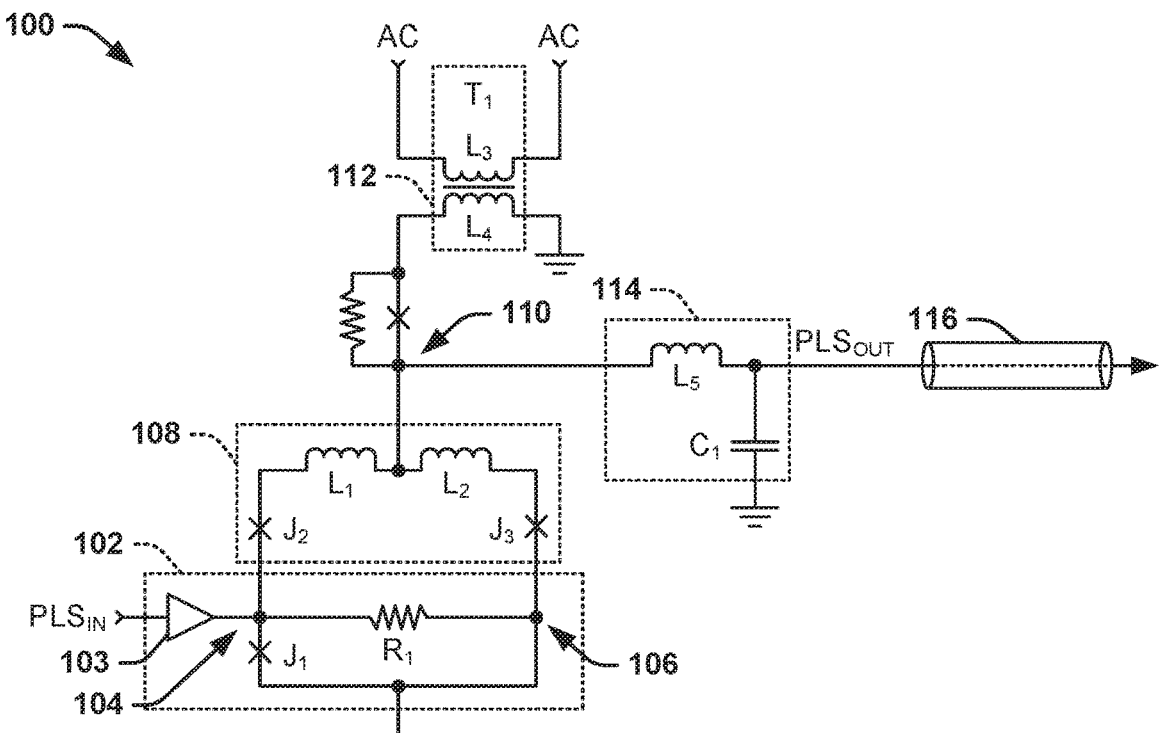
FIG. 3 illustrates another example of a superconducting transmission line driver circuit.

FIG. 3 illustrates an example of a superconducting transmission line driver circuit 100. The superconducting transmission line driver circuit 100 can correspond to the superconducting transmission line driver system 10 in the example of FIG. 1. Therefore, reference is to be made to the example of FIG. 1 in the following example of FIG. 3.

The superconducting transmission line driver circuit 100 is configured similar to the superconducting transmission line driver circuit 50 in the example of FIG. 2. In the example of FIG. 3, the superconducting transmission line driver circuit 100 includes an input stage 102 that is configured to receive a trigger pulse $PLS_{IN}$ that can be provided as an SFQ pulse or an RQL. The input stage 102 includes a JTL 103 to propagate the trigger pulse $PLS_{IN}$, such as from a sequence of other JTLs, and a Josephson junction $J_1$ that is configured to trigger in response to the trigger pulse $PLS_{IN}$. As an example, the Josephson junction $J_1$ can be arranged as an unshunted Josephson junction. The input stage 102 further includes a resistor $R_1$ that is coupled to a node 104 and a node 106, and can provide shunting for the Josephson junction $J_1$.

The superconducting transmission line driver circuit 100 also includes a SQUID 108 that is coupled to the input stage 102. The SQUID 108 includes a first Josephson junction $J_2$ and a second Josephson junction $J_3$ that are coupled, respectively, to the nodes 104 and 106, such that the nodes 104 and 106 form a portion of the SQUID 108. In the example of FIG. 3, the Josephson junctions $J_2$ and $J_3$ can be configured as unshunted Joscphson junctions. The SQUID 108 also includes a pair of inductors $L_1$ and $L_2$ that are coupled, respectively, to the Josephson junctions $J_2$ and $J_3$ and which are separated by a node 110, which can alternatively be arranged as a single inductor with a connection in an approximate center instead of the node 110.

The superconducting transmission line driver circuit 100 also includes an AC bias current source 112 that is demonstrated in the example of FIG. 3 as a transformer $T_1$. The transformer $T_1$ includes a primary winding $L_3$ through which an AC signal AC, which can correspond to RQL clock signal, is provided, and includes a secondary winding $L_4$. In addition, the superconducting transmission line driver circuit 100 includes a Josephson junction $J_4$ that is shunted via a resistor R2 interconnecting the AC bias current source 112 and the SQUID 108. Therefore, the transformer $T_1$ can inductively provide an AC bias current $I_{BIAS}$ via the secondary winding $L_4$ through the Josephson junction $J_4$. The AC bias current $I_{BIAS}$ is provided to the node 110 to bias the Josephson junctions $J_2$ and $J_3$ of the SQUID 108. Therefore, in response to the trigger pulse $PLS_{IN}$, the Josephson junction $J_1$ can trigger, which can thus activate the Josephson junctions $J_2$ and $J_3$ to likewise trigger in response to a positive portion of the AC bias current $I_{BIAS}$ (e.g., during a positive portion of the AC bias current $I_{BIAS}$).

The superconducting transmission line driver circuit 100 also includes an LPF 114 that is coupled to the SQUID 108 via the node 110. In the example of FIG. 3, the LPF 114 is demonstrated as an LC filter that includes an inductor $L_5$ that interconnects the node 110 and a transmission line 116 (e.g., an approximately 25-ohm transmission line), and also includes a capacitor $C_1$ interconnecting the inductor $L_5$ and a low-voltage rail (e.g., ground). The LPF 114 is configured to filter the sequential SFQ pulses generated by the SQUID 108 and provided on the node 110 to generate a single amplified output pulse, demonstrated in the example of FIG. 3 as $PLS_{OUT}$, similar to as described previously regarding the example of FIG. 2. The output pulse $PLS_{OUT}$ can be a positive pulse or a negative pulse at respective positive and negative portions of the AC bias current $I_{BIAS}$, similar to as described previously in the example of FIG. 2.

In the example of FIG. 3, the Josephson junction $J_4$ can be configured to provide current clamping of the AC bias current $I_{BIAS}$. For example, the Josephson junctions $J_2$ and $J_3$ can be fabricated to have a critical current that is tuned to trigger in response to the trigger pulse PLS (e.g., in response to the triggering of the Josephson junction $J_1$) at a substantial peak amplitude of the AC bias current $I_{BIAS}$. However, a variety of factors can result in a variation of the amplitude of the AC bias current $I_{BIAS}$, such that the AC bias current $I_{BIAS}$ could spuriously trigger an activation of one or both of the Josephson junctions $J_2$ and $J_3$. As a result, the Josephson junctions $J_2$ and $J_3$ could undesirably latch in the voltage state to provide the amplified output pulse $PLS_{OUT}$ across the transmission line 116 via the LPF 114. However, the Josephson junction $J_4$ can be tuned with a critical current that is less than the critical currents of the Josephson junctions $J_2$ and $J_3$. As a result, the Josephson junction $J_4$ can trigger in response to a predetermined amplitude of the AC bias current $I_{BIAS}$, thus clamping the amplitude of the AC bias current $I_{BIAS}$ to the predetermined amplitude that resulted in the triggering of the Josephson junction $J_4$. As a result, the AC bias current $I_{BIAS}$ can be limited to the predetermined amplitude to mitigate the occurrence of spurious triggering of the Josephson junctions $J_2$ and $J_3$, such as in the absence of the trigger pulse $PLS_{IN}$.

Figure 4:
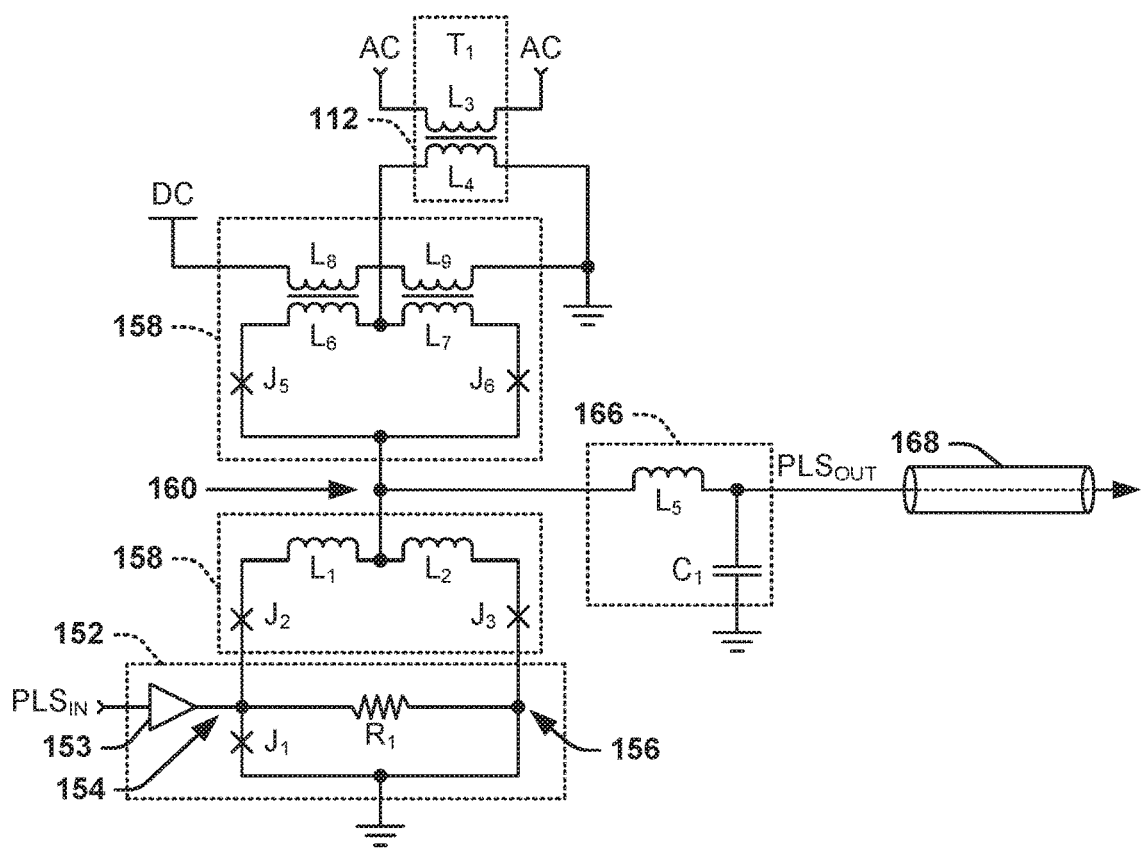
FIG. 4 illustrates yet another example of a superconducting transmission line driver circuit.

FIG. 4 illustrates an example of a superconducting transmission line driver circuit 150. The superconducting transmission line driver circuit 150 can correspond to the superconducting transmission line driver system 10 in the example of FIG. 1. Therefore, reference is to be made to the example of FIG. 1 in the following example of FIG. 4.

The superconducting transmission line driver circuit 150 is configured similar to the superconducting transmission line driver circuit 50 in the example of FIG. 2. In the example of FIG. 4, the superconducting transmission line driver circuit 150 includes an input stage 152 that is configured to receive a trigger pulse $PLS_{IN}$ that can be provided as an SFQ pulse or an RQL. The input stage 152 includes a JTL 153 to propagate the trigger pulse $PLS_{IN}$, such as from a sequence of other JTLs, and a Josephson junction $J_1$ that is configured to trigger in response to the trigger pulse $PLS_{IN}$. As an example, the Josephson junction $J_1$ can be arranged as an unshunted Josephson junction. The input stage 152 further includes a resistor $R_1$ that is coupled to a node 154 and a node 156, and can provide shunting for the Josephson junction $J_1$.

The superconducting transmission line driver circuit 150 also includes a first SQUID 158 that is coupled to the input stage 152. The first SQUID 158 includes a first Josephson junction $J_2$ and a second Josephson junction $J_3$ that are coupled, respectively, to the nodes 154 and 156, such that the nodes 154 and 156 form a portion of the first SQUID 158. In the example of FIG. 4, the Josephson junctions $J_2$ and $J_3$ can be configured as unshunted Josephson junctions. The first SQUID 158 also includes a pair of inductors $L_1$ and $L_2$ that are coupled, respectively, to the Josephson junctions $J_2$ and $J_3$ and which are separated by a node 160, which can alternatively be arranged as a single inductor with a connection in an approximate center instead of the node 160.

The superconducting transmission line driver circuit 150 also includes an AC bias current source 162 that is demonstrated in the example of FIG. 4 as a transformer $T_1$. The transformer $T_1$ includes a primary winding $L_3$ through which an AC signal AC, which can correspond to RQL clock signal, is provided, and includes a secondary winding $L_4$. In addition, the superconducting transmission line driver circuit 150 includes a second SQUID 164 that interconnects the AC bias current source 162 and the first SQUID 158. The second SQUID 164 includes a first Josephson junction $J_5$ and a second Josephson junction $J_6$ that are coupled, respectively, to the node 160. In the example of FIG. 4, the Josephson junctions $J_5$ and $J_6$ can be configured as unshunted Josephson junctions. The second SQUID 164 also includes a pair of inductors $L_6$ and $L_7$ that are arranged as secondary windings with respect to primary windings $L_8$ and $L_9$, respectively. A DC current, labeled in the example of FIG. 4 as a signal "DC", is provided through the primary windings $L_8$ and $L_9$ to provide a DC bias current $I_{DC}$ in the second SQUID 164 to enable asymmetrical operation of the second SQUID 164, as described in greater detail herein.

Therefore, the transformer $T_1$ can inductively provide an AC bias current $I_{BIAS}$ via the secondary winding $L_4$. The AC bias current $I_{BIAS}$ is provided to the node 160 to bias the Josephson junctions $J_2$ and $J_3$ of the first SQUID 158 in a positive portion of the AC bias current $I_{BIAS}$. Therefore, in response to the trigger pulse $PLS_{IN}$, the Josephson junction $J_1$ can trigger, which can thus activate the Josephson junctions $J_2$ and $J_3$ to likewise trigger in response to a positive portion of the AC bias current $I_{BIAS}$ (e.g., during a positive portion of the AC bias current $I_{BIAS}$).

The superconducting transmission line driver circuit 150 also includes an LPF 166 that is coupled to the first SQUID 158 via the node 160. In the example of FIG. 4, the LPF 166 is demonstrated as an LC filter that includes an inductor $L_5$ that interconnects the node 160 and a transmission line 168 (e.g., an approximately 25-ohm transmission line), and also includes a capacitor $C_1$ interconnecting the inductor $L_5$ and a low-voltage rail (e.g., ground). The LPF 166 is configured to filter the sequential SFQ pulses generated by the first SQUID 158 and provided on the node 160 to generate a single amplified output pulse, demonstrated in the example of FIG. 4 as $PLS_{OUT}$, similar to as described previously regarding the example of FIG. 2.

In the example of FIG. 4, the secondary winding $L_4$ of the AC bias current source 162 can have a very high inductance. Additionally, as described previously, the second SQUID 164 can operate asymmetrically, such that the second SQUID 164 can be configured to trigger in response to one direction of the AC bias current $I_{BIAS}$ and not the other direction of the AC bias current $I_{BIAS}$. For example, the second SQUID 164 can be configured to conduct the positive portion of the AC bias current $I_{BIAS}$ to the first SQUID 158 without triggering, and can be configured to trigger the Josephson junctions $J_5$ and $J_6$ in response to the negative portion of the AC bias current $I_{BIAS}$. Therefore, during the negative portion of the AC bias current $I_{BIAS}$, the Josephson junctions $J_5$ and $J_6$ can repeatedly trigger in the voltage state. In response to the repeated triggering of the Josephson junctions $J_5$ and $J_6$, the Josephson junctions $J_2$ and $J_3$ can be reset back to the zero superconducting phase state without providing the repeated negative flux pulses to the LPF 166. Because of the high inductance of the secondary winding $L_4$ of the AC bias current source 162, the sequential flux pulses generated by the Josephson junctions $J_5$ and $J_6$ in the voltage state are substantially blocked from being provided on the AC bias current $I_{BIAS}$, and are instead induced to ground via the inductive coupling to the inductors $L_8$ and $L_9$. Accordingly, because the second SQUID 164 can block negative flux pulses from being provided to the LPF 166, the superconducting transmission line driver circuit 150 can be configured to only provide positive output pulses $PLS_{OUT}$ to the transmission line 168.

Figure 5:
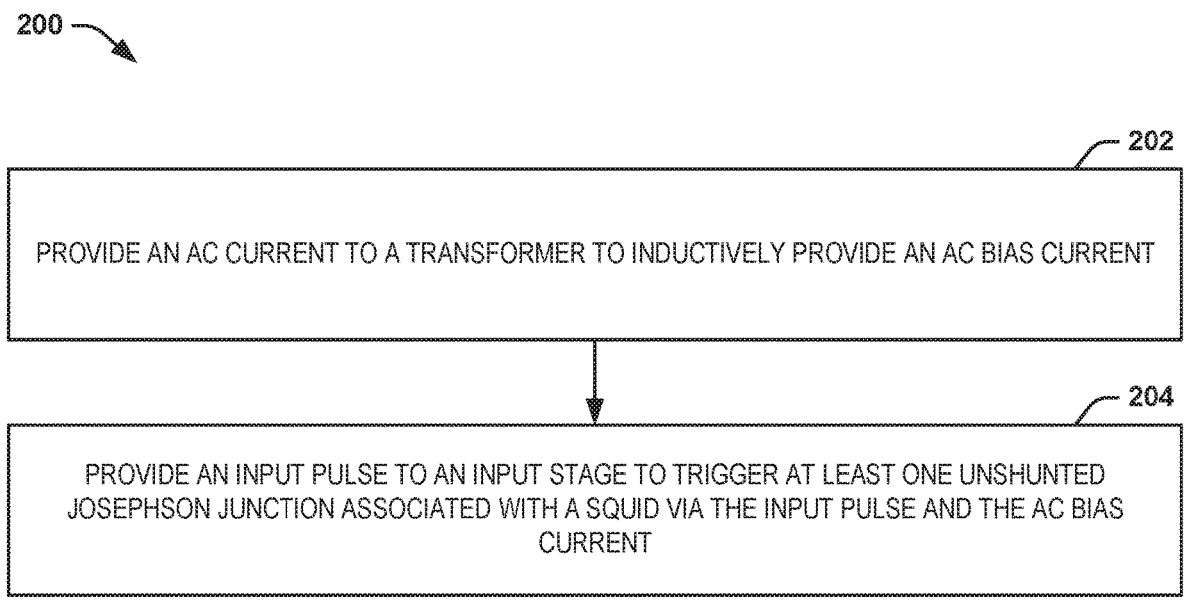
FIG. 5 illustrates an example of a method for providing an amplified output pulse to a transmission line.

In view of the foregoing structural and functional features described above, a methodology in accordance with various aspects of the present invention will be better appreciated with reference to FIG. 5. While, for purposes of simplicity of explanation, the methodology of FIG. 5 is shown and described as executing serially, it is to be understood and appreciated that the present invention is not limited by the illustrated order, as some aspects could, in accordance with the present invention, occur in different orders and/or concurrently with other aspects from that shown and described herein. Moreover, not all illustrated features may be required to implement a methodology in accordance with an aspect of the present invention.

FIG. 5 illustrates an example of a method 200 providing an amplified output pulse (e.g., the output pulse $PLS_{OUT}$) to a transmission line (e.g., the transmission line 66). At 202, an AC current (e.g., the AC current AC) is provided to a transformer (e.g., the AC bias current source 62) to inductively provide an AC bias current (e.g., the AC bias current $I_{BIAS}$). At 204, an input pulse (e.g., the trigger pulse $PLS_{IN}$) is provided to an input stage (e.g., the input stage 12) to trigger at least one unshunted Josephson junction (e.g., the Josephson junctions $J_2$ and $J_3$) associated with a SQUID (e.g., the SQUID 58) via the input pulse and the AC bias current. The at least one unshunted Josephson junction can be configured to generate a plurality of sequential SFQ pulses in response to being triggered. The plurality of sequential SFQ pulses can be filtered via a low-pass filter (e.g., the LPF 18) to generate the amplified output pulse that is provided on the transmission line via the low-pass filter.

What have been described above are examples of the disclosure. It is, of course, not possible to describe every conceivable combination of components or method for purposes of describing the disclosure, but one of ordinary skill in the art will recognize that many further combinations and permutations of the disclosure are possible. Accordingly, the disclosure is intended to embrace all such alterations, modifications, and variations that fall within the scope of this application, including the appended claims.

What is claimed is:

1. A superconducting transmission line driver system comprising:
   an input stage configured to receive an input pulse;
   an AC bias current source configured to provide an AC bias current;
   an amplifier coupled to the input stage and configured to generate a plurality of sequential single flux quantum (SFQ) pulses based on the input pulse in response to the AC bias current; and
   a low-pass filter configured to filter the plurality of sequential SFQ pulses by aggregating the plurality of sequential SFQ pulses to generate an amplified output pulse that is output to a transmission line.

2. The system of claim 1, wherein the amplifier is configured as a SQUID comprising at least one unshunted Josephson junction.

3. The system of claim 2, wherein the at least one Josephson junction comprises a plurality of Josephson junctions, wherein the AC bias current is provided to the SQUID to repeatedly trigger the plurality of Josephson junctions associated with the SQUID in a common mode to generate the plurality of sequential SFQ pulses during a positive portion of a period of the AC bias current and to reset the plurality of Josephson junctions during a negative portion of the period of the AC bias current.

4. The system of claim 3, wherein the SQUID is further configured to repeatedly to generate a plurality of sequential negative SFQ pulses during a negative portion of the period of the AC bias current, wherein the low-pass filter is further configured to filter the plurality of sequential negative SFQ pulses by aggregating the plurality of negative sequential SFQ pulses to generate an amplified negative output pulse that is output to the transmission line.

5. The system of claim 2, wherein the input stage further comprises:
   an input Josephson junction that is triggered via the input pulse to initiate the plurality of sequential SFQ pulses in response to the input pulse; and
   a resistor coupled to the SQUID and being configured to shunt the input Josephson junction and to provide for common-mode oscillation of a pair of Josephson junctions associated with the SQUID.

6. The system of claim 2, further comprising a shunted Josephson junction interconnecting the AC bias current source and the SQUID, the shunted Josephson junction providing clamping of an amplitude of the AC bias current to mitigate spurious activation of the SQUID.

7. The system of claim 2, wherein the SQUID is configured to generate a plurality of positive sequential SFQ pulses based on a positive portion of the AC bias current and to generate a plurality of negative sequential SFQ pulses based on a negative portion of the AC bias current, such that the low-pass filter is configured to filter the plurality of positive sequential SFQ pulses by aggregating the plurality of positive sequential SFQ pulses to generate an amplified positive output pulse that is output to the transmission line, and is further configured to filter the plurality of negative sequential SFQ pulses by aggregating the plurality of negative sequential SFQ pulses to generate an amplified negative output pulse that is output to the transmission line.

8. The system of claim 2, wherein the SQUID is a first SQUID, wherein the first SQUID is configured to generate a plurality of positive sequential SFQ pulses based on a positive portion of the AC bias current, the system further comprising a second SQUID interconnecting the AC bias current source and the first SQUID, the second SQUID being configured to generate a plurality of sequential SFQ pulses based on a negative portion of AC bias current to reset the first SQUID and suppress the generation of negative sequential SFQ pulses via the first SQUID.

9. The system of claim 1, wherein the input pulse is provided as a reciprocal quantum logic (RQL) pulse.

10. The system of claim 6, wherein the AC bias current source comprises a transformer, the transformer comprising:
    a primary winding configured to conduct a reciprocal quantum logic (RQL) clock signal; and
    a secondary winding configured to inductively provide the AC bias current in response to the RQL clock signal.

11. A method for providing an amplified output pulse to a transmission line, the method comprising:
    providing an AC current to a transformer to inductively provide an AC bias current; and
    providing an input pulse to an input stage to trigger at least one unshunted Josephson junction associated with a SQUID via the input pulse and the AC bias current, the at least one unshunted Josephson junction being configured to generate a plurality of sequential single flux quantum (SFQ) pulses in response to being triggered, the plurality of sequential SFQ pulses being filtered via a low-pass filter by aggregating the plurality of sequential SFQ pulses to generate the amplified output pulse that is provided on the transmission line via the low-pass filter.

12. The method of claim 11, wherein the input stage comprises a resistor coupled to the SQUID, such that the at least one unshunted Josephson junction is arranged as a plurality of Josephson junctions that are configured to repeatedly generate the plurality of sequential SFQ pulses in a common mode in response to being triggered at a positive portion of the AC bias signal, and are reset at a negative portion of the AC bias signal.

13. The method of claim 11, wherein the input stage comprises a resistor coupled to the SQUID, such that the at least one unshunted Josephson junction is further configured to repeatedly to generate a plurality of sequential negative SFQ pulses in a common mode in response to being reset at a negative portion of the AC bias signal.

14. The method of claim 11, wherein providing the AC current comprises providing a reciprocal quantum logic (RQL) clock signal to the transformer, and wherein providing the input pulse comprises providing an RQL pulse.

15. The method of claim 11, wherein providing the AC current comprises providing the AC bias current through a shunted Josephson junction to the SQUID, the shunted Josephson junction providing clamping of an amplitude of the AC bias current to mitigate spurious activation of the SQUID.

16. The method of claim 11, wherein the SQUID is a first SQUID, the method further comprising providing a DC bias current to a transformer to induce a DC bias current to a second SQUID that is coupled to the first SQUID, the second SQUID comprising a plurality of Josephson junctions that are activated in response to the DC bias current and a negative portion of the AC bias current to reset the first SQUID and to suppress the generation of negative sequential SFQ pulses via the first SQUID.

17. A superconducting transmission line driver system comprising:
  an input stage configured to receive a reciprocal quantum logic (RQL) pulse;
  an AC bias current source configured to inductively provide an AC bias current based on an RQL clock signal;
  a SQUID coupled to the input stage and configured to generate a plurality of sequential positive SFQ pulses in a positive portion of the AC bias current and in response to the input pulse, and to generate a plurality of negative flux quantum pulses in a negative portion of the AC bias current; and
  a low-pass filter configured to filter the plurality of sequential positive single flux quantum (SFQ) pulses by aggregating the plurality of sequential positive SFQ pulses to generate an amplified positive output pulse that is output to a transmission line, and to filter the plurality of sequential negative SFQ pulses by aggregating the plurality of sequential negative SFQ pulses to generate an amplified negative output pulse that is output to the transmission line.

18. The system of claim 17, wherein SQUID comprises a plurality of unshunted Josephson junctions to generate the plurality of sequential positive SFQ pulses and the plurality of sequential negative SFQ pulses.

19. The system of claim 17, wherein the input stage further comprises:
  an input Josephson junction that is triggered via the input pulse to initiate the plurality of sequential SFQ pulses via the RQL pulse; and
  a resistor coupled to the SQUID and being configured to shunt the input Josephson junction and to provide for common-mode oscillation of a pair of Josephson junctions associated with the SQUID.

20. The system of claim 17, further comprising a shunted Josephson junction interconnecting the AC bias current source and the SQUID, the shunted Josephson junction providing clamping of an amplitude of the AC current to mitigate spurious activation of the SQUID.

* * * * *